(12) United States Patent
Förderer et al.

(10) Patent No.: US 6,352,634 B1
(45) Date of Patent: Mar. 5, 2002

(54) METHOD FOR PRODUCING A LEAD-FREE SUBSTRATE

(75) Inventors: Heinz Förderer, Grosskrotzenburg; Thomas Frey, Hanau; Günter Herklotz, Bruchköbel, all of (DE)

(73) Assignee: W. C. Heraeus GmbH & Co. KG, Hanau (DE)

( * ) Notice: Subject to any disclaimer, the term of this patent is extended or adjusted under 35 U.S.C. 154(b) by 0 days.

(21) Appl. No.: 09/445,196

(22) PCT Filed: Jun. 7, 1999

(86) PCT No.: PCT/EP99/03910

§ 371 Date: Feb. 1, 2000

§ 102(e) Date: Feb. 1, 2000

(87) PCT Pub. No.: WO99/64198

PCT Pub. Date: Dec. 16, 1999

(30) Foreign Application Priority Data

Jun. 10, 1998 (DE) .......................................... 198 25 805
Nov. 3, 1998 (DE) .......................................... 198 50 526

(51) Int. Cl.[7] .............................. C25D 5/12; C25D 5/10
(52) U.S. Cl. ........................ 205/181; 205/170; 205/176
(58) Field of Search ................................ 205/176, 181, 205/170

(56) References Cited

U.S. PATENT DOCUMENTS

| 4,529,667 | A | * | 7/1985 | Shiga et al. | 428/646 |
| 5,360,991 | A | | 11/1994 | Abys et al. | 257/666 |
| 5,436,082 | A | | 7/1995 | Mathew | 428/670 |
| 5,510,197 | A | * | 4/1996 | Takahashi et al. | 428/670 |
| 6,150,713 | A | * | 11/2000 | Park et al. | 257/677 |

FOREIGN PATENT DOCUMENTS

EP        4414729      11/1994

* cited by examiner

*Primary Examiner*—Edna Wong
(74) *Attorney, Agent, or Firm*—Fulbright & Jaworski L.L.P.

(57) ABSTRACT

A method for the manufacture of a leadless substrate with a basic body made of copper or copper base alloy, a solder layer applied to at least one portion of the basic body and made of metals belonging to the group of gold, gold alloy, silver, silver alloy, palladium, and palladium alloy, as well as an intermediate layer arranged between the basic body and the solder layer and made of nickel or nickel alloy, wherein the solder layer consists of at least two separate layers made of different metals and wherein the intermediate layer and the separate layers are deposited by electroplating, characterized in that at least one separate layer is made of silver or silver alloy.

11 Claims, No Drawings

METHOD FOR PRODUCING A LEAD-FREE SUBSTRATE

The invention relates to a method for the manufacture of a leadless substrate with a basic body made of copper or copper base alloy, a solder layer applied onto at least one portion of the basic body and made of metals belonging to the group of gold, gold alloy, silver, silver alloy, palladium, and palladium alloy, as well as an intermedi-ate layer arranged between the basic body and the solder layer and made of nickel or nickel alloy.

Usually, the solders or solder layers used in soldering are containing lead. In order to be able to avoid the use of lead with its high toxicity, it is necessary to apply leadless and solderable layers with a good adhesive strength and resistance to oxidation, whose wettability is, for instance, similarly high as that of customary tin-lead solder layers.

Solder layers of this type are known from DE 44 14 729 C2. A basis strip of copper or copper alloy is coated with an intermediate layer of nickel or nickel alloy. Then a protective layer is applied using the thin-layer method protecting the basis strip from any oxidative attacks. The material is used for the manufacture of a conductor frame for structural semiconductor elements, using a protective layer with a thickness ranging from 1nm to 50nm. This vapor-deposited thin protective layer ensures that the basis strip is well protected from oxidation and that the mechanical stability of a wire joint or soldered joint which is to be subsequently made between the protective layer and a structural element or a printed circuit board is satisfactory. The manufac-ture of a thin protective layer requires a great number of devices. For instance, sput-ter or vapor deposition systems are expensive, need much maintenance, and are generally intended for vacuum procedures which must be performed in a clean room environment.

An electroplated protective layer of gold—which must, however, have a thickness of several $\mu$m in order to be able to fulfill the function of a "protective layer", —is another expensive possibility that also ensures the mechanical stability. However, a protective layer manufactured according to the thin-layer method is, in general, classified more efficient with regard to reliability than an electroplated layer.

Tests confirmed the disadvantages of electroplated protective layers shown in DE 44 14 729C2(see Table 1). The wetting rate for as manufactured, leadfree substrates and leadfree substrates aged in air at a temperature of 155°C. over 16h (IEC 68-2-2; DIN EN 60068-2-2) was determined by means of solder scales. Solder scales are equipped with a load-sensing device which is sensitive enough to measure the interfacial forces between a molten solder and the specimen to be soldered.

Decisive features for the soldering process are the quality and the rate at which a specimen to be soldered is wetted by a liquid solder under equal test conditions. The specimen is, in part, immersed in the liquid solder, and the forces acting upon the specimen as a result of its reaction with the liquid are measured. The force resulting from the vertical lifting and wetting forces, which acts upon the immersed specimen over a specific time interval, is measured and recorded by means of a measuring transformer. Evaluation is made whenever the wetting force is equal to the counter-directed lifting force; this results in the fact that the resulting force acting upon the specimen is equal to zero. The time elapsing until this condition is achieved is proportional the wetting rate of the respective sample.

The measured values listed in Table 1 were determined in a solder bath with the fol-lowing parameters:

temperature: 240° C.
immersion rate: 5 mm/sec
immersion depth: 5 mm
fluxing agent: FSW-31 (600 g pure colophony in 1 l of isopropyl alcohol), nonacti-vating
measuring time: 5 sec

TABLE 1

| Layer system | Wetting time (sec) before ageing | Wetting time (sec) After ageing |
| --- | --- | --- |
| 5 $\mu$m Sn/Pb 60/40 (comparison value) | 0.45 | 0.50 |
| 2 $\mu$m Ni + 0.1 $\mu$m to 0.2 $\mu$m Pd | 1.50 | 2.05 |
| 2 $\mu$m Ni/P + 0.1 $\mu$m to 0.2 $\mu$m Pd | 1.50 | 1.65 |
| 2 $\mu$m Ni + 5 $\mu$m Ag | 0.90 | 1.00 |
| 2 $\mu$m Ni + 0.2 $\mu$m Pd/Ni | 3.95 | >5.00 |
| 2 $\mu$m Ni + 0.5 $\mu$m Au (fine) | 1.00 | 1.00 |
| 2 $\mu$m Ni + 0.5 $\mu$m Au/Co (hard Au) | 1.15 | 4.55 |

The problem is to provide a more cost-effective procedure for the manufacture of a leadfree substrate, allowing a wetting time of less than 1 second after ageing ac-cording to DIN EN 60068-2-2.

Surprisingly, this problem is solved by the fact that the solder layer consists of at least two separate layers made of different metals and that both the intermediate layer and the separate layers are deposited by electroplating. A satisfactorily high mechanical stability of a wire joint or a soldered joint between the solder layer and a structural element or a printed circuit board is ensured over a long time.

It has proven advantageous when the intermediate layer has a thickness ranging from 0.1 $\mu$m to 10 $\mu$m. This can be achieved by using a commercially available nickel bath on sulphamate basis in conjunction with a current density ranging from 0.5 A/dm$^2$ to 10 A/dm$^2$.

An effective solder layer is made of a first and a second separate layer. The first separate layer decoupled onto the intermediate layer should have a thickness rang-ing from 0.01 $\mu$m to 5 $\mu$m; the second separate layer should have a thickness ranging from 0.01 $\mu$m to 10 $\mu$m. Ideally however, the first separate layer is made with a thick-ness ranging from 0.1 $\mu$m to 1.0 $\mu$m and the second separate layer with a thickness ranging from 0.3 $\mu$m to 2.5 $\mu$m. It is, however, also possible to make the solder layer of more than two or three separate layers.

A solder layer consisting of a first separate layer of palladium or palladium alloy and a second separate layer of silver or silver alloy has proved successful. It is, however, also advantageous if one of the two separate layers is made of gold or gold alloy. In this case, it is possible to make the first separate layer of gold or gold alloy and the second separate layer of silver or silver alloy or, as an alternative, the second sepa-rate layer of gold or gold alloy and the first separate layer of silver or silver alloy. Ammoniacal baths can be used for the manufacture of separate layers of palladium or palladium alloy and cyanidic baths for the manufacture of separate layers of gold or gold alloy, each in conjunction with a current density ranging from 0.1 A/dm$^2$ to 5 A/dm$^2$.

High wetting rates after ageing can also be achieved, if the solder layer is made of a first, a second and a third separate layer, with the first separate layer deposited onto the intermediate layer and the second separate layer each having a thickness rang-ing from 0.01 $\mu$m to 5 $\mu$m and the third separate layer having a thickness ranging from 0.01 $\mu$m to 10 $\mu$m. Ideally, the first separate layer has a thickness ranging from 0.1 $\mu$m to 1 $\mu\mu$m and the second and third separate layers each have a thickness ranging from 0.3 $\mu$m to 2.5 $\mu$m.

It has proved favorable, when the first separate layer is made of palladium or palla-dium alloy and the second separate layer is made of silver or silver alloy and is con-nected to a third separate layer of gold or gold alloy. However, if the first separate layer is made of palladium or palladium alloy and the second separate layer is made of gold or gold alloy and is connected to a third separate layer of silver or silver alloy, the wetting rate is even higher after ageing.

As a matter of principle, a pure-tin layer can be applied onto any solder layer. If a separate layer of silver or silver alloy is the to$\mu$most layer, it is advantageous if it is coated with a tarnish protection layer which prevents silver from tarnishing, i.e. from oxidizing. The formation of silver sulphide is particularly unwanted, and is, for in-stance, effectively prevented by the use of thiols.

All substrates reach a low wetting time, which is even reduced for some substrates after ageing. After ageing, wetting times of less than one second are measured for all leadfree substrates: in part, the reference value of 0.5 sec, which is valid for Sb/Pb solder layers, is even fallen below. The measuring results reached with the following parameters are listed in Table 2:

temperature: 240° C.
immersion rate: 5 mm/sec
immersion depth: 5 mm
fluxing agent: FSW-31 (600 g pure colophony in 1 l of isopropyl alcohol), nonacti-vating
measuring time: 5 sec

TABLE 2

| Layer system | Wetting time (sec) before ageing | Wetting time (sec) after ageing |
| --- | --- | --- |
| 5 $\mu$m Sn/Pb 60/40 (comparison value) | 0.45 | 0.50 |
| 2 $\mu$m Ni + 0.1 $\mu$m to 0.2 $\mu$m Pd + 0.5 $\mu$m Ag | 0.70 | 0.75 |
| 2 $\mu$m Ni + 0.1 $\mu$m to 0.2 $\mu$m Pd + 2.0 $\mu$m Ag | 0.60 | 0.65 |
| 2 $\mu$m Ni + 0.5 $\mu$m Pd + 0.5 $\mu$m Ag | 0.55 | 0.70 |
| 2 $\mu$m Ni + 0.5 $\mu$m Pd + 1.0 $\mu$m Ag | 0.65 | 0.75 |
| 2 $\mu$m Ni + 0.5 $\mu$m Pd + 2.0 $\mu$m Ag | 0.65 | 0.80 |
| 2 $\mu$m Ni + 0.2 $\mu$m Pd/Ni (80 w/w percent Pd, 20 w/w percent Ni) + 0.5 $\mu$m Ag | 0.50 | 0.45 |
| 2 $\mu$m Ni + 0.2 $\mu$m Pd/Ni (80 w/w percent Pd, 20 w/w percent Ni) + 2.0 $\mu$m Ag | 0.50 | 0.40 |
| 2 $\mu$m Ni + 0.2 $\mu$m Pd/Ni (80 w/w percent Pd, 20 w/w percent Ni) + 0.5 $\mu$m Ag | 0.45 | 0.40 |
| 2 $\mu$m Ni + 0.2 $\mu$m Pd/Ni (80 w/w percent Pd, 20 w/w percent Ni) + 2.0 $\mu$m Ag | 0.45 | 0.45 |
| 2 $\mu$m Ni + 0.1 $\mu$m to 0.2 $\mu$m Pd + 0.2 $\mu$m Ag (with tarnish preventive) | 0.40 | 0.60 |
| 2 $\mu$m Ni + 0.2 $\mu$m Pd + 0.5 $\mu$m Ag (with tarnish preventive) | 0.40 | 0.50 |
| 2 $\mu$m Ni + 0.5 $\mu$m Pd + 2.0 $\mu$m Ag (with tarnish preventive) | 0.40 | 0.50 |
| 2 $\mu$m Ni + 0.8 $\mu$m Au (fine) + 0.5 $\mu$m Ag | 0.40 | 0.45 |
| 2 $\mu$m Ni + 0.2 $\mu$m Au (fine) + 0.5 $\mu$m Ag | 0.45 | 0.50 |
| 2 $\mu$m Ni + 0.2 $\mu$m Au/Co (hard gold) + 0.5 $\mu$m Ag | 0.45 | 0.50 |
| 2 $\mu$m Ni + 0.2 $\mu$m Au/Co (hard gold) + 2.0 $\mu$m Ag | 0.45 | 0.45 |
| 2 $\mu$m Ni + 0.2 $\mu$m Au (fine) + 2.0 $\mu$m Ag | 0.45 | 0.50 |
| 2 $\mu$m Ni + 0.5 $\mu$m Ag + 0.5 $\mu$m Au (fine) | 1.00 | 0.50 |
| 2 $\mu$m Ni + 0.5 $\mu$m Ag + 0.5 $\mu$m Au/Co (hard gold) | 1.30 | 0.55 |
| 2 $\mu$m Ni + 0.5 $\mu$m Ag + 0.2 $\mu$m Au (fine) | 0.60 | 0.40 |
| 2 $\mu$m Ni + 0.5 $\mu$m Ag + 0.2 $\mu$m Au/Co (hard gold) | 0.80 | 0.50 |
| 2 $\mu$m Ni + 0.2 $\mu$m Pd + 0.5 $\mu$m Ag + 0.5 $\mu$m Au (fine) | 0.55 | 0.45 |
| 2 $\mu$m Ni + 0.2 $\mu$m Pd + 0.5 $\mu$m Ag + 0.5 $\mu$m Au/Co (hard gold) | 0.80 | 0.50 |
| 2 $\mu$m Ni + 0.2 $\mu$m Pd + 0.2 $\mu$m Au (fine) + 0.5 $\mu$m Ag | 0.50 | 0.45 |
| 2 $\mu$m Ni + 0.2 $\mu$m Pd + 0.2 $\mu$m Au/Co (hard gold) + 0.5 $\mu$m Ag | 0.45 | 0.40 |

The following examples are intended to explain the invention-relating procedure for the manufacture of a lead-free substrate in more detail:

EXAMPLE 1

Procedure for the manufacture of a leadfree substrate with a solder layer made of Pd/Ni and Ag

EXAMPLE 2

Procedure for the manufacture of a leadfree substrate with a solder layer made of Pd, Au/Co (hard gold) and Ag

EXAMPLE 1

Cleaning, degreasing and rinsing of a basic body made of copper

Coating of the copper with 2.0 $\mu$m nickel in a commercial electroplating nickel bath on sulphamate basis with a current density of 2.5 A/dm$^2$ and subsequent rinsing phase Coating of the nickel layer with 0.2 $\mu$m Pd/Ni in an ammoniacal Pd/Ni bath with a current density of 1.0 A/dm$^2$ and subsequent rinsing phase Coating of the Pd/Ni layer with 2.0 $\mu$m Ag in a cyanidic Ag bath with a current den-sity of 1.0 A/dm$^2$ and subsequent rinsing phase Drying Ageing in air at a temperature of 155° C. over 16 h

EXAMPLE 2

Cleaning, degreasing and rinsing of a basic body made of copper

Coating of the copper with 2.0 $\mu$m nickel in a commercial electroplating nickel bath on sulphamate basis with a current density of 2.5 Ad/m$^2$ and subsequent rinsing phase Coating of the nickel layer with 0.2 $\mu$m Pd in an ammoniacal Pd bath with a current density of 1.0 A/dm$^2$ and subsequent rinsing phase Coating of the Pd layer with 0.2 $\mu$m Au/Co (hard gold) in a cyanidic Au/Co bath with a current density of 1.0 A/dm$^2$ and subsequent rinsing phase Coating of the Au/Co layer with 0.5 $\mu$m Ag in a cyanidic Ag bath with a current density of 1.0 A/dm$^2$ and subsequent rinsing phase Drying Ageing in air at a temperature of 155° C. over 16 h

SUMMARY

The invention relates to a method for the manufacture of a leadless substrate with a basic body made of copper or copper base alloy, a solder layer applied onto at least one portion of the ba-sic body and made of metals belonging the group of gold, gold alloy, silver, silver alloy, palla-dium, and palladium alloy, as well as an intermediate layer arranged between the basic body and the solder layer and made of nickel or nickel alloy. A cost-effective method for the manu-facture of a leadless substrate is provided, with which a wetting time of less than one second is achieved after ageing according to DIN EN 60068-2-2, by making the solder layer of at least two separate layers of different metals and depositing the intermediate layer and the separate layers by electroplating.

What is claimed is:

1. A method for the manufacture of a leadfree substrate comprising:

electroplating an intermediate layer comprising nickel or nickel alloy onto a basic body made of copper or copper base alloy to form a nickel plated basic body; and electroplating a solder layer comprising at least two uppermost separate layers onto at least one portion of said nickel plated basic body to form the leadfree substrate, wherein said at least two uppermost separate layers are made of different metals selected from the group consisting of silver, silver alloy, palladium, palladium alloy, gold and gold alloy, and wherein one of the uppermost separate layers is made of silver or silver alloy and wherein the other uppermost separate layer is made of gold or gold alloy, wherein the final uppermost separate layer is deposited in a thickness ranging from 0.3 micrometers to 2.5 micrometers.

2. The method of claim 1, wherein the layer electroplated onto the nickel plated basic body has a thickness ranging from 0.01 micrometers to 5 micrometers.

3. The method of claim 2, wherein said thickness ranges from 0.1 micrometers to 1 micrometers.

4. The method of claim 2, wherein the uppermost separate layer is made of gold or gold alloy and the other layer is made of silver or silver alloy.

5. The method of claim 2, wherein the uppermost layer is made of silver or silver alloy and the other layer is made of gold or gold alloy.

6. The method of claim 1, wherein the solder layer further comprises a third separate layer, said third separate layer being electroplated on said nickel plated basic body and made of a metal different than the other two separate uppermost layers selected from the group consisting of silver, silver alloy, palladium, palladium alloy, gold and gold alloy.

7. The method of claim 6, wherein said third separate layer is deposited in a thickness ranging from 0.1 micrometer to 1 micrometer, and the separate layer deposited on said third layer ranges from 0.3 micrometers to 2.5 micrometers.

8. The method of claim 6, wherein the separate layers of the solder layer have an order from the basic body outward to the final uppermost separate layer, said order being a) palladium or palladium alloy; b) silver or silver alloy and c) gold or gold alloy.

9. The method of claim 6, wherein the separate layers of the solder layer have an order from the basic body outward to the uppermost layer, said order being a) palladium or palladium alloy; b) gold or gold alloy and c) silver or silver alloy.

10. The method of claim 6, wherein a tarnish protection layer is applied to said uppermost final layer.

11. The method of claim 1, wherein a tarnish protection layer is applied to said final uppermost separate layer.

* * * * *